(12) United States Patent
Levy et al.

(10) Patent No.: US 7,446,063 B1
(45) Date of Patent: Nov. 4, 2008

(54) SILICON NITRIDE FILMS

(75) Inventors: Sagy Levy, Sunnyvale, CA (US); Mehran Sedigh, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 3 days.

(21) Appl. No.: 11/362,278

(22) Filed: Feb. 24, 2006

Related U.S. Application Data

(60) Provisional application No. 60/656,009, filed on Feb. 24, 2005.

(51) Int. Cl.
*H01L 21/469* (2006.01)
*H01L 21/31* (2006.01)

(52) U.S. Cl. .............................. 438/794; 257/E21.293

(58) Field of Classification Search ................ 428/769, 428/680, 488, 787; 257/E21.293; 438/791, 438/794
See application file for complete search history.

(56) References Cited

U.S. PATENT DOCUMENTS

| | | | |
|---|---|---|---|
| 6,544,900 B2 * | 4/2003 | Raaijmakers et al. | 438/769 |
| 6,586,163 B1 * | 7/2003 | Okabe et al. | 430/317 |
| 6,680,516 B1 | 1/2004 | Blosse et al. | |
| 6,706,576 B1 * | 3/2004 | Ngo et al. | 438/197 |
| 6,803,321 B1 | 10/2004 | Blosse et al. | |
| 2002/0127828 A1 * | 9/2002 | Suzuki et al. | 438/488 |
| 2004/0087090 A1 * | 5/2004 | Grudowski et al. | 438/275 |
| 2004/0102040 A1 * | 5/2004 | Adetutu et al. | 438/680 |
| 2004/0115897 A1 * | 6/2004 | Inoue et al. | 438/424 |
| 2005/0252529 A1 | 11/2005 | Ridgeway et al. | |
| 2006/0073706 A1 * | 4/2006 | Li et al. | 438/710 |

OTHER PUBLICATIONS

Encyclopedia of Chemical Technology, Kirk-Othmer, vol. 14, pp. 677-709, (1995).

\* cited by examiner

*Primary Examiner*—Asok K Sarkar

(57) ABSTRACT

A method of forming structures comprises depositing silicon nitride films simultaneously on a plurality of substrates at a first temperature, and heating the silicon nitride films at a temperature greater than the first temperature.

20 Claims, 5 Drawing Sheets

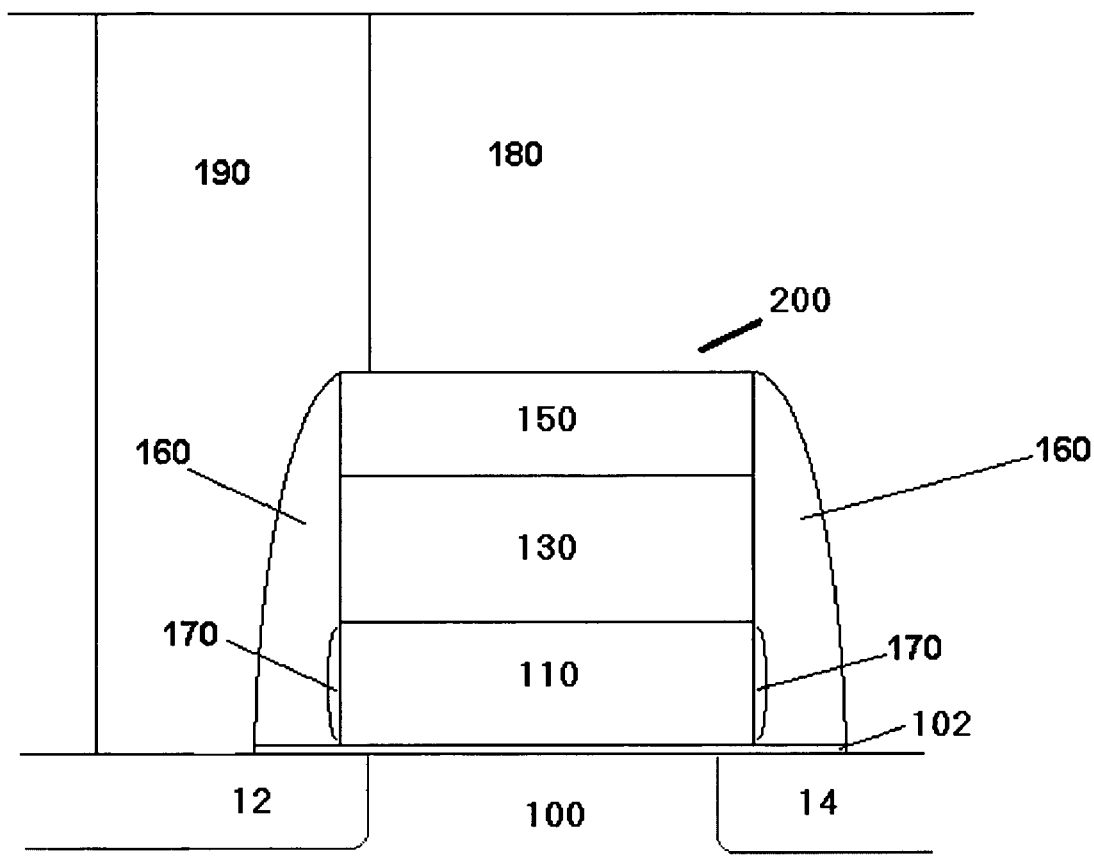

SILICON NITRIDE FILMS

CROSS-REFERENCE TO RELATED APPLICATION

This application claims priority to provisional application No. 60/656,009 entitled "METHOD OF IMPROVING THE COMPOSITIONAL UNIFORMITY OF SILICON NITRIDE FILMS" filed 24 Feb. 2005, the entire contents of which are hereby incorporated by reference, except where inconsistent with the present application.

BACKGROUND

Self-aligned contacts (SAC) allow the design of a semiconductor device to have a distance between the gate and the contact to the substrate, to be at most one-half the minimum gate width. Typically, SAC uses a nitride layer on the gate stack, together with spacers that include nitride, to prevent a misaligned contact from contacting the gate itself. If the nitride were not present, then the etch used to form the hole which will become the contact would pass through the dielectric layer all the way to the gate, when misaligned. When present, the nitride layer and spacers acts as an etch stop, preventing misalignment form forming a hole all the way to the gate, and therefore allowing design of the device to have a much smaller average distance between the contact and the gate.

Chemical vapor deposition (CVD) of silicon nitride at low temperatures is conventionally carried out in a vertical furnace, using gases containing a silane, for example bis-(t-butylamino) silane (BTBAS) and ammonia ($NH_3$). Typically, each zone of the furnace is maintained at a constant, relatively low temperature, during the deposition. A cold feed of $NH_3$ and BTBAS is introduced at the bottom of the furnace through a distribution tray. The low temperature deposition reduces the overall thermal budget in forming devices, preventing damage to the device, and is especially important as device dimensions are reduced. For example, U.S. Pat. No. 6,803,321 to Blosse et al. issued 12 Oct. 2004 describes low temperature CVD of silicon nitride films for spacers.

This current approach produces non-uniform silicon nitride films across the wafer, and from wafer to wafer within a batch of wafers processed simultaneously in a vertical furnace. It is believed that due to the colder temperature of the process gas at a lower or bottom zone of the furnace during silicon nitride deposition, less hydrogen (H) is incorporation into the silicon nitride film at the bottom zone. This lower hydrogen content results in a lower RI (refractive index), and a greater etch rate when using a fluorine containing gas (such as $CHF_3/O_2$ chemistry, typically used for spacer overetch due the relatively high selectivity of this etching chemistry to silicon oxide ($SiO_2$)). Table 1 shows the properties of silicon nitride films deposited on a batch of wafers, by location in the furnace during deposition. Shrinkage is the percent shrinkage of the film thickness after heating at 1000° C.

TABLE 1

| Location in furnace | Spacer etch, overetch (angstroms) | Shrinkage (%) | RI | H content |
|---|---|---|---|---|
| Top | 148 | 11.03 | 1.9295 | 2.53E+21 |
| Center | 160 | 10.96 | 1.9178 | 2.04E+21 |
| Bottom | 187 | 11.81 | 1.8909 | 1.59E+21 |
| Standard deviation (%) | 12.17 | 4.19 | 1.03 | 22.8 |

To compensate for the lower etch rate of wafers processed at the top and/or the center part of the furnace during silicon nitride deposition, a longer overetch is used, which in turn reduces the amount of silicon nitride over the gate stacks, and in spacers surrounding the gate stacks. This loss of silicon nitride during etching of silicon nitride produced by conventional low temperature CVD requires that the distance between the gate stack and the contact in self-aligned contacts, be maintained to minimize the contact-to-gate leakage.

BRIEF DESCRIPTION OF THE DRAWINGS

FIG. 5 illustrates a semiconductor structure including a gate stack.

DETAILED DESCRIPTION

The present invention makes use of the discovery that heating silicon nitride films at a temperature greater than the deposition temperature improves the uniformity of the films, reducing the variation of the etch rate of the films. This is particularly important during formation of spacers, where the silicon nitride is etched using etch chemistry highly selective to silicon oxide.

The silicon nitride film is preferably formed by chemical vapor deposition (CVD) with a gas containing a silane, more preferably with a silane of the formula $Si_xL_{2x}$, where x is 1 or 2, and L is an amino group, to form a nitride layer, more preferably BTBAS (bis-(t-butylamino)silane). Preferably, L is an alkyl amino group. The different L groups may be the same or different. Preferably, the reaction is with a nitrogen containing compound, more preferably with a hydrogen and nitrogen containing compound, most preferably with ammonia.

The ratio between the silane:nitrogen containing compound is preferably 1:0.5 to 1:5, more preferably 1:1 to 1:3, most preferably 1:2. The pressure during nitride formation is preferably 100-300 mTorr, more preferably 150 mTorr.

The nitride layer is preferably formed at a temperature of at most 600° C., more preferably at a temperature below 600° C., even more preferably at a temperature of at most 570° C. The temperature is preferably 500-600° C., more preferably, 550-565° C.

Figure 1:
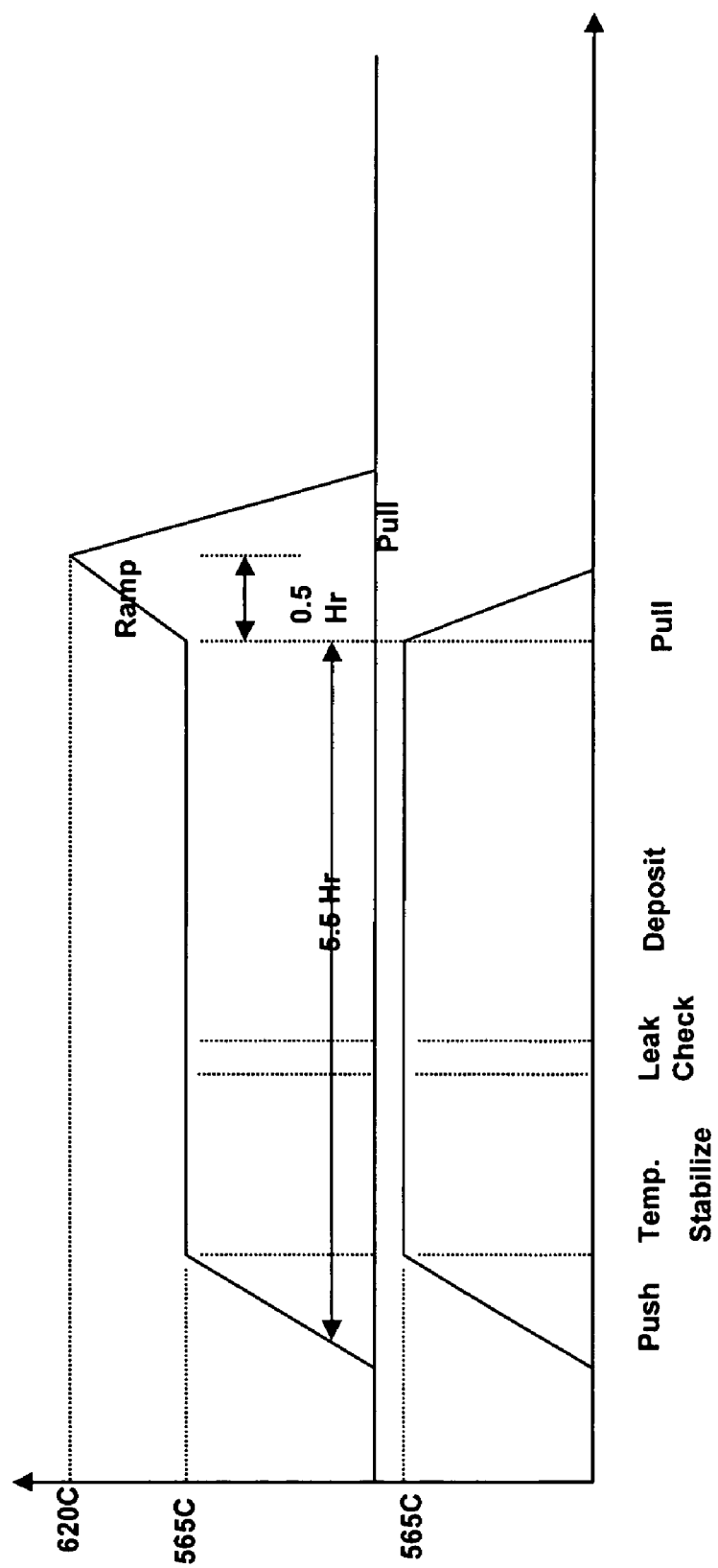
FIG. 1 is a graph comparing processing temperature, time and ramp rates for a conventional deposition method and a deposition method of an embodiment of the present invention.

The silicon nitride films are heated at a temperature greater than the deposition temperature, to increase the uniformity of the films. Heating temperatures and ramp rates or heating times include, for example, heating 40° C. to 100° C. above the deposition temperature, such as 50° C. to 60° C. above the deposition temperature, and heating times, including the temperature ramp, of 5 minutes to 5 hours, including 0.5 to 1 hour. Referring to FIG. 1, in a preferred embodiment, the heating is an in-situ anneal (heating without removing the wafers from the deposition furnace), such as a ramping of the temperature in the vertical furnace after deposition is complete, improving the composition of the film and the subsequent etch rate (ER) uniformity across the batch of wafers processed simultaneously in the furnace. In the example shown in the top portion of the graph in FIG. 1, the 5.5 hour deposition is followed by ramping the wafers from a final deposition temperature of 565° C. to 620° C. in a relatively short time of 0.5 hours. When carried out in-situ, there is no significant impact on throughput. Alternative, the heating of the silicon nitride film may be carried out in a different furnace than the furnace used for deposition (ex-situ), for example in a rapid thermal anneal (RTA) system or apparatus. However, although this approach would be equally effective in providing a more uniform composition of the silicon nitride film and the subsequent ER, the additional step may impact overall processing time and fab throughput, and might raise thermal budget issues. In contrast, as seen from the graph of FIG. 1 in the preferred in-situ embodiment, there is no significant impact on throughput.

A table showing composition data for a silicon nitride film deposited at different locations in a vertical furnace using a deposition method according to an embodiment of the present invention is shown in Table 2.

TABLE 2

| Location in furnace | Spacer etch, overetch (angstroms) | Shrinkage (%) | RI | H content |
|---|---|---|---|---|
| Top | 149 | 11.02 | 1.9273 | 2.06E+21 |
| Center | 155 | 11 | 1.9153 | 2.76E+21 |
| Bottom | 166 | 11.4 | 1.8949 | 2.22E+21 |
| Standard deviation (%) | 5.5 | 2.02 | 0.86 | 3.67 |

Comparing Table 2 to Table 1 reveals that implementing an in-situ annealing significantly improves hydrogen content uniformity across the batch of wafers. Table 2 also shows that hydrogen content uniformity improvement directly impacts spacer etch uniformity, which can reduce the percent overetch (O.E.) required and increases the SAC margin for contact-to-gate leakage. Finally, comparing particles for a deposition and anneal process method according to an embodiment of the present invention and a conventional deposition process shows there is no increase in particles for a deposition and anneal process method according to an embodiment of the present invention, as compared to a conventional deposition process.

The advantages of the method of the present invention over previous or conventional approaches include: (i) improved hydrogen content uniformity in silicon nitride films across the batch of wafers; (ii) reduced overetch requirement in spacer etch applications due to the more uniform film composition, thereby increasing remaining silicon nitride on the spacer sidewall and on top of the gate stack (reducing chances of contact-to-gate leakage); (iii) no additional steps are required; (iv) minimal impact on throughput; and (v) no increase in particle generation due to thermal cycling of the furnace. The present method is particularly suitable when the deposition furnace is cleaned every 5-10 runs with an in situ clean using $NF_3$, such as that described in U.S. Patent Application Publication 2005-0252529, but without using a plasma during the clean.

Figure 2:
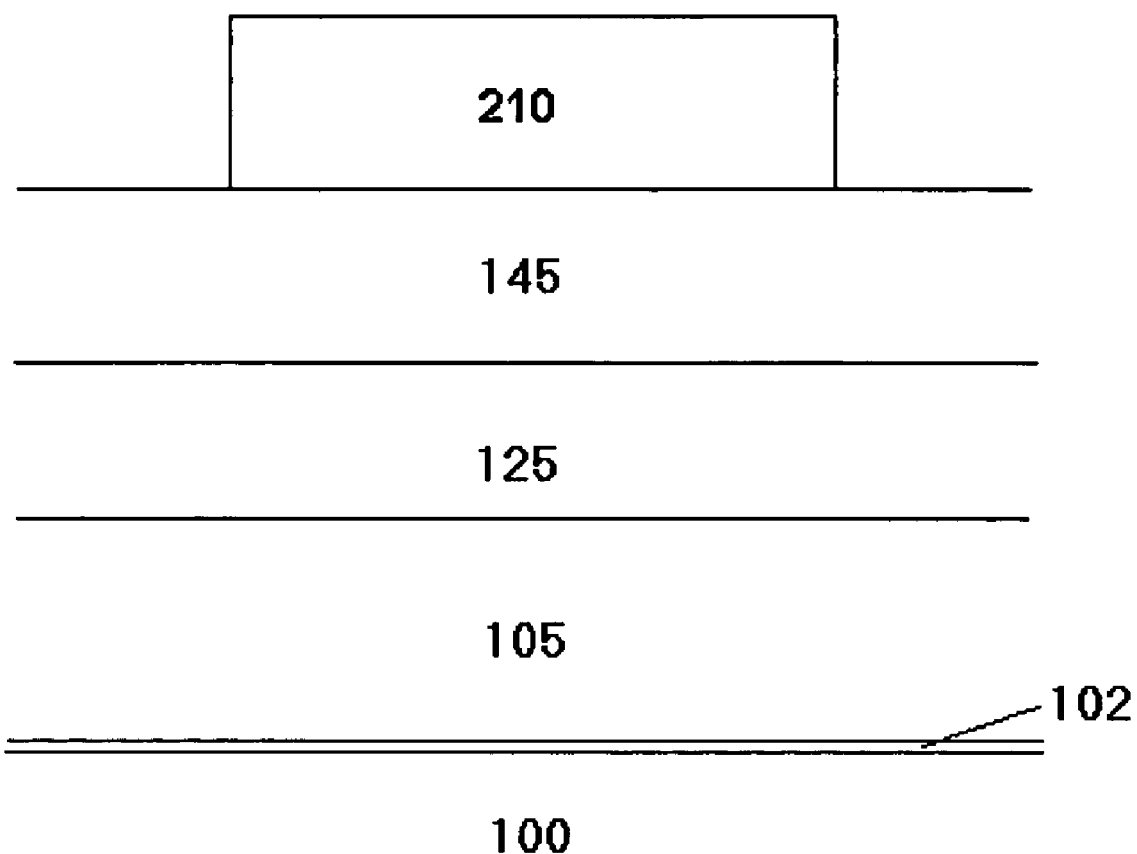
FIGS. 2-4 illustrate formation of a gate stack.
Figure 3:
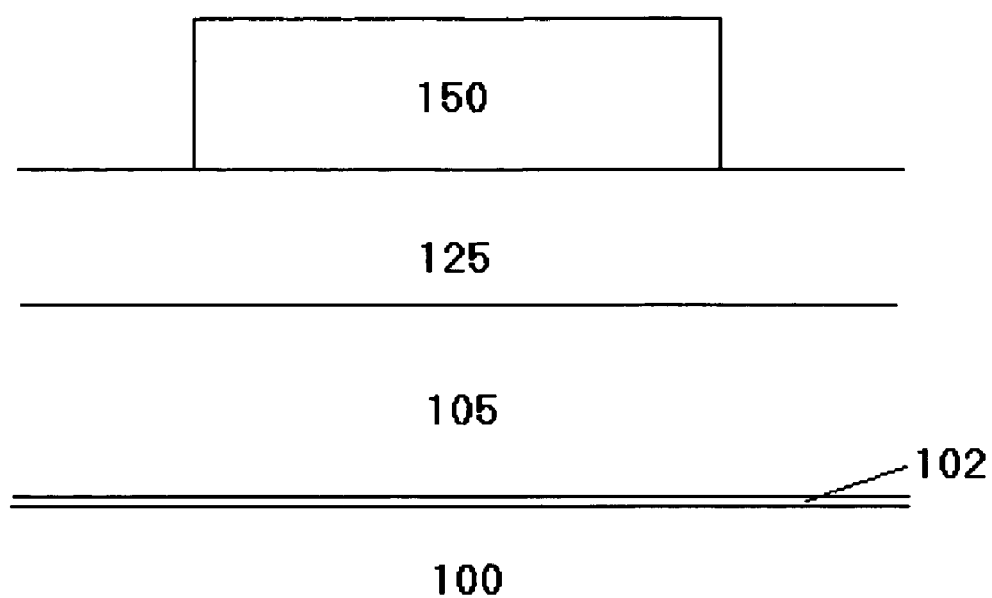
Figure 4:
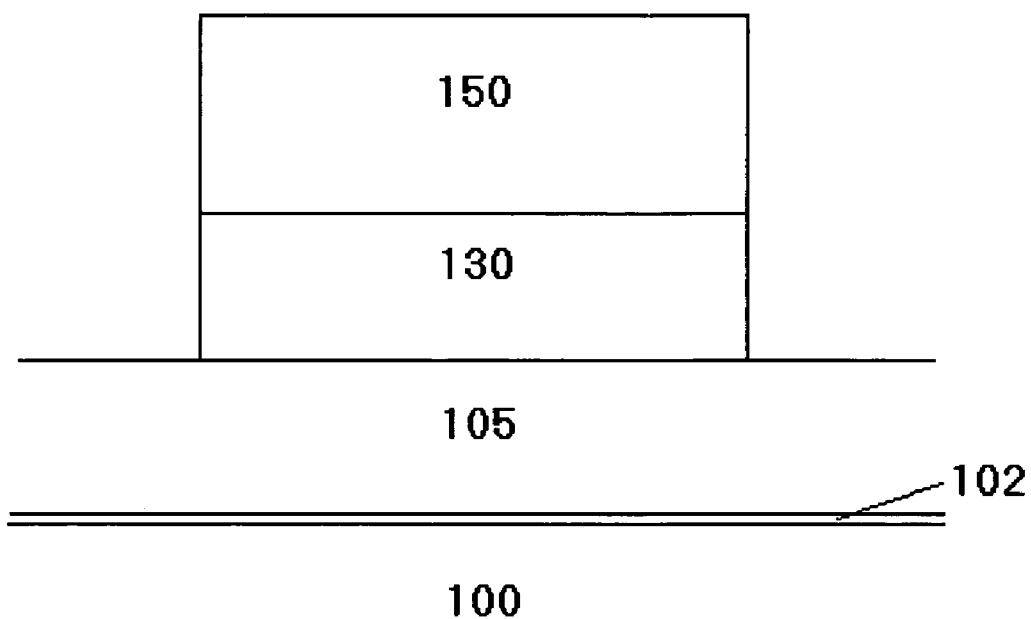

FIGS. 2-4 illustrate formation of a gate stack. Further details of an example of a gate stack may be found in U.S. Pat. No. 6,680,516 to Blosse et al. issued 20 Jan. 2004. As shown in FIG. 2, a gate layer 105 is formed on a gate insulating layer 102 which is on a semiconductor substrate 100, a metallic layer 125 is formed on the gate layer, an etch-stop layer 145 is formed on the metallic layer, and a photoresist layer 210 is formed and patterned on the etch-stop layer.

The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer may be a conventionally known insulating material. For example, the gate insulating layer may contain silicon oxide or silicon oxynitride.

The gate layer may contain a variety of semiconducting materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are $P^+$ doped (such as with B or $BF_2^+$) are over $N^-$ doped channel regions of the substrate, forming a PMOS device; those regions of the gate that are $N^+$ doped (such as with $As^+$ or phosphorus$^+$) are over $P^-$ doped channel regions of the substrate, forming an NMOS device. The $P^+$ and $N^+$ doping regions of the gate are separated by a region which is on an isolation region of the substrate; this isolation region has a width of at most 0.4 microns, more preferably at most 0.36 microns. The doping of the regions of the gate is preferably carried out after or during the forming of the gate, by masking and doping each region separately, or by an overall doping of the gate with one dopant type, and then masking and doping only one region with the other dopant type (counter doping).

The metallic layer 125 may contain a variety of metal-containing materials. For example, a metallic layer may contain aluminum, copper, tantalum, titanium, tungsten, or alloys or compounds thereof. Preferably, the metallic layer comprises tungsten. Preferably, the etch-stop layer is a nitride layer, more preferably the etch-stop layer is silicon nitride. The etch-stop layer may vary in composition, so that the top of the etch-stop layer is anti-reflective, for example so that the top of the etch-stop layer is silicon rich silicon nitride, or silicon oxynitride. Alternatively, a separate anti-reflective layer (ARC) may be formed.

Referring to FIGS. 3 and 4, each layer may be patterned to form the gate stack. The patterning may be accomplished, for example, by conventional photolithographic and etching techniques. As shown in FIG. 3, the etch-stop layer may be etched to form a patterned etch-stop layer 150, for example by etching the portions of the etch-stop layer 145 exposed through the patterned photoresist 210 (FIG. 2). The patterned etch-stop layer may be used as a hard mask for the etching of the metallic layer 125 (FIG. 3) to form a patterned metallic layer 130, as shown in FIG. 4. The patterned etch-stop layer and the patterned metallic layer may be used as a hard mask for the etching of the gate layer 105 to form a patterned gate layer 110 (not illustrated), completing formation of the gate stack 200 (not illustrated).

A sidewall oxide 170 may then be formed on the gate stack, and then spacers 160 may be formed on the sides of the gate stack. FIG. 5 illustrates a semiconductor structure including a gate stack 200. Semiconductor substrate 100 supports a gate insulating layer 102, which in turn supports a gate layer 110. The gate layer supports a metallic layer 130. The etch stop layer 150 is on the metallic layer 130. The structure includes sidewall oxide regions 170 on gate layer 110 and spacers 160 on the sides of the gate stack. Furthermore, a dielectric layer 180 maybe formed on the etch-stop layer, and contacts or via 190 formed through the dielectric to the substrate.

The spacers are formed by chemical vapor deposition (CVD) of silicon nitride with a gas containing a silane, as described above. Once the layer is deposited, the spacers may be formed by etching the nitride layer, by conventional nitride etching. Common etchant gases for etching silicon nitride to form spacers include fluorine containing gas, for example $C_4F_8/O_2/N_2$, $CHF_3/CF_4/O_2/Ar$, $C_2Fr/Ar$, or $SF_6$.

Preferably, if a split gate is present, the spacers are formed so that there is not substantial diffusion between the P⁺ region and the N⁺ region of the split gate. "Substantial diffusion between the P⁺ region and the N⁺ region" of the gate means that the threshold voltage ($V_T$) one or both of the PMOS device or NMOS device changes by more than 20 mV, more preferably 10 mV, even more preferably 5 mV. In order to determine if spacer formation results in substantial diffusion between the P⁺ region and the N⁺ region of a particular split gate, a single PMOS device or NMOS device is formed, with the other part of the gate forming a comparatively very large reservoir of the opposite doping type, separated by an isolation region of the same size as the actual device. The PMOS device or NMOS device is formed using the selective oxidation and the nitride deposition used in the example of U.S. Pat. No. 6,803,321, and spacer formation of interest.

Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively); Microchip Fabrication 4th. edition, Peter Van Zant, McGraw-Hill, 2000; U.S. Pat. No. 6,680,516 to Blosse et al. issued 20 Jan. 2004; and U.S. Pat. No. 6,803,321 to Blosse et al. issued 12 Oct. 2004.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, mobile phone, an airplane or an automobile.

The invention claimed is:

1. A method of forming structures, comprising:
   depositing silicon nitride films simultaneously on a plurality of substrates at a first temperature, wherein each substrate comprises gate stacks formed before the depositing of the silicon nitride films;
   heating the silicon nitride films at a temperature greater than the first temperature, to increase uniformity of hydrogen content in the silicon nitride films; and
   performing additional processing to the structures to complete formation of a semiconductor device.

2. The method of claim 1, wherein the depositing is carried out at a temperature of at most 600° C.

3. The method of claim 2, further comprising etching the silicon nitride films to form spacers, on the semiconductors and in contact with the gate stacks.

4. The method of claim 3, wherein the etching is carried out with etchant gases comprising fluorine containing gas.

5. The method of claim 4, wherein etchant gases comprise at least one member selected from the group consisting of $C_4F_8$, $CHF_3$, $CF_4$, $C_2F_6$ and $SF_6$.

6. The method of claim 4, wherein the etchant gases comprise $CHF_3$ and $O_2$.

7. The method of claim 2, wherein the depositing is carried out at a temperature of 550-570° C.

8. The method of claim 7, wherein the heating is carried out at a temperature 40-100° C. above the first temperature.

9. The method of claim 8, wherein the heating is carried out for 15 minutes to 5 hours.

10. The method of claim 8, wherein the heating is carried out for 0.5-1 hour.

11. The method of claim 7, wherein the heating is carried out at a temperature 50-60° C. above the first temperature.

12. The method of claim 2, wherein the heating is carried out at a temperature 40-100° C. above the first temperature.

13. A method of making semiconductor devices, comprising:
    forming semiconductor structures by the method of claim 2, and
    forming semiconductor devices from the semiconductor structures.

14. A method of making electronic devices, comprising:
    forming semiconductor devices by the method of claim 13, and
    forming electronic devices comprising the semiconductor devices.

15. A method of forming semiconductor structures, comprising:
    forming gate stacks on a plurality of semiconductor wafers;
    depositing silicon nitride films simultaneously on the plurality of wafers, at a first temperature of at most 600° C., by chemical vapor deposition with a gas comprising bis-(t-butylamino)silane;
    heating the silicon nitride films to a temperature 50-60° C. above the first temperature;
    and etching the silicon nitride films to form spacer;
    wherein the etching is carried out with etchant gases comprising fluorine containing gas.

16. The method of claim 15, wherein the etchant gases comprise $CHF_3$ and $O_2$.

17. The method of claim 15, wherein the depositing is carried out at a temperature of 550-570° C.

18. A method of making semiconductor devices, comprising:
    forming semiconductor structures by the method of claim 15, and
    forming semiconductor devices from the semiconductor structures.

19. A method of making electronic devices, comprising:
    forming semiconductor devices by the method of claim 18, and
    forming electronic devices comprising the semiconductor devices.

20. In a method of forming spacers on a plurality of wafers, including forming gate stacks on the wafers, forming silicon nitride films simultaneously on the wafers at a first temperature below 600° C. with a gas comprising bis-(t-butylamino)silane, and etching the silicon nitride films with a fluorine containing gas to form the spacers, the improvement comprising heating the silicon nitride films to a temperature 40-100° C. above the first temperature prior to the etching.

* * * * *